United States Patent
Seddon (10) Patent No.: US 7,790,004 B2
(45) Date of Patent: Sep. 7, 2010

(54) SUBSTRATE HOLDER FOR A VAPOUR DEPOSITION SYSTEM

(75) Inventor: Richard I. Seddon, Santa Rosa, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 942 days.

(21) Appl. No.: 11/205,513

(22) Filed: Aug. 17, 2005

(65) Prior Publication Data

US 2006/0049044 A1   Mar. 9, 2006

Related U.S. Application Data (63) Continuation-in-part of application No. 10/968,642, filed on Oct. 19, 2004.

(60) Provisional application No. 60/603,211, filed on Aug. 20, 2004.

(51) Int. Cl.
```
C25B 9/00      (2006.01)
C23C 14/00     (2006.01)
C25B 11/00     (2006.01)
C25B 13/00     (2006.01)
C23C 16/00     (2006.01)
```
(52) U.S. Cl. .................. 204/298.15; 204/298.23; 204/298.27; 118/728; 118/729; 118/730

(58) Field of Classification Search .............. 118/706, 118/720, 728, 729, 730; 204/192.12, 192.29, 204/298.11, 298.25, 298.15, 298.23, 298.27; 427/100; 428/138

See application file for complete search history.

(56) References Cited

U.S. PATENT DOCUMENTS

| | | | |
|---|---|---|---|
| 3,616,452 A | 10/1971 | Bessot et al. | 204/298.06 |
| 3,858,547 A | 1/1975 | Bergfelt | 118/730 |
| 4,034,704 A | 7/1977 | Wossner et al. | 118/730 |
| 4,222,345 A * | 9/1980 | Bergfelt et al. | 118/720 |
| 4,226,208 A * | 10/1980 | Nishida et al. | 118/706 |
| 4,250,009 A | 2/1981 | Cuomo et al. | 204/192.11 |
| 4,485,759 A | 12/1984 | Brandolf | 118/503 |
| 4,704,306 A * | 11/1987 | Nakamura | 427/100 |

(Continued)

FOREIGN PATENT DOCUMENTS

EP     1139393     10/2001

(Continued)

OTHER PUBLICATIONS

European Search Report, European Published Patent Application No. 1903603, Aug. 6, 2009.

*Primary Examiner*—Alexa D Neckel
*Assistant Examiner*—Michael Band
(74) *Attorney, Agent, or Firm*—Matthew A. Pequignot; Pequignot + Myers LLC (57) ABSTRACT

The invention relates to a partially disposable substrate holder used in magnetic latches for securing substrates on a planetary rotating platform suspended above a coating source in a vacuum chamber of a vapor deposition system, e.g. a chemical vapor deposition (CVD) system or a physical vapor deposition (PVD) system. The substrate holder includes a reusable base formed, at least partially, from a ferro-magnetic material, which is attracted to the magnetic latch, and a disposable cover formed from a relatively inexpensive, ferromagnetic, easily formable material, which encourages adherence of coating material and has a low vapor pressure at coating temperatures.

16 Claims, 12 Drawing Sheets

U.S. PATENT DOCUMENTS

| | | | |
|---|---|---|---|
| 4,960,485 A | 10/1990 | Ichinose et al. | 156/556 |
| 4,988,424 A * | 1/1991 | Woodward et al. | 204/192.29 |
| 5,106,346 A | 4/1992 | Locher et al. | 475/11 |
| 5,232,569 A | 8/1993 | Nelson et al. | 204/192.15 |
| 5,710,407 A | 1/1998 | Moore et al. | 219/405 |
| 5,795,448 A | 8/1998 | Hurwitt et al. | 204/192.1 |
| 5,820,329 A | 10/1998 | Derbinski et al. | 414/225.01 |
| 6,030,513 A * | 2/2000 | Ghantiwala et al. | 204/298.11 |
| 6,054,029 A * | 4/2000 | Kempf et al. | 204/298.25 |
| 6,096,404 A * | 8/2000 | Ghantiwala | 428/138 |
| 6,264,804 B1 * | 7/2001 | Lee et al. | 204/192.12 |
| 6,464,825 B1 | 10/2002 | Shinozaki | 156/345.55 |
| 6,800,833 B2 | 10/2004 | Gregor et al. | 219/390 |
| 6,844,274 B2 | 1/2005 | Yoshioka et al. | 438/800 |
| 2005/0014368 A1 | 1/2005 | Yoshioka et al. | 438/689 |
| 2005/0189228 A1 | 9/2005 | Huang | 205/157 |

FOREIGN PATENT DOCUMENTS

| | | | |
|---|---|---|---|
| JP | 59014640 A * | 1/1984 | |
| JP | 61010239 | 1/1986 | |
| JP | 61157682 A * | 7/1986 | |
| JP | 63094424 A * | 4/1988 | |
| JP | 63257942 A * | 10/1988 | |
| JP | 03247762 A * | 11/1991 | |
| JP | 10060625 A * | 3/1998 | |
| JP | 11131212 A * | 5/1999 | |
| RU | 2008501 | 2/1994 | |
| WO | 02/19379 | 3/2002 | |
| WO | 03/034419 | 4/2003 | |

\* cited by examiner

SUBSTRATE HOLDER FOR A VAPOUR DEPOSITION SYSTEM

CROSS-REFERENCE TO RELATED APPLICATIONS

The present invention claims priority from U.S. Patent Application No. 60/603,211 filed Aug. 20, 2004, and is a continuation in part of U.S. patent application Ser. No. 10/968,642 filed Oct. 19, 2004, which are incorporated herein by reference for all purposes.

TECHNICAL FIELD

The present invention relates to a substrate holder for use in a vapor deposition system, and in particular to a partially disposable substrate holder for use with a magnetic latch, which suspends the substrate holder in a vacuum chamber of a physical vapor deposition (PVD) system or a chemical vapor deposition (CVD) system.

BACKGROUND OF THE INVENTION

Multi-layer precision coatings, such as those used small optical systems, are commonly produced in PVD or CVD systems. Many of these coatings are applied to substrates formed of thin flat disks, which are subsequently cut to size.

The coating flux from a source in a PVD or a CVD system are relatively stable; however, they have a spatial distribution that can lead to deposited films with non-uniform thickness, if the substrates remain stationary. To improve uniformity, the geometrical relationship between the source and substrate must be selected appropriately. Good results have been observed when the substrate is rotated about an axis perpendicular to the plane of the surface to be coated, and in particular when multiple substrates have been mounted on multiple spindles in a planetary configuration.

For repeatable thickness control and low defect count the substrate holders must locate the substrate very precisely relative to the other motion elements, and must hold the substrate securely to prevent sliding motion, which could generate particulate contamination under acceleration or temperature changes. Furthermore, the surface of the tooling, (the jig lip) which supports the substrate, must be polished, and must be very thin to prevent shadowing of coating flux arriving at non-normal incidence. The rear surface of the substrate must be shielded to prevent stray coating material from becoming deposited thereon.

To meet these demanding requirements substrate holders for high volume production are typically made of stainless, or even hardened stainless, steel, which is relatively expensive and difficult to maintain. Surfaces adjacent to the substrate are exposed to the same coating flux as the substrate, e.g. multi-layers of hard metal oxides. Unfortunately, the coating on the substrate holders builds up with each coating run and, if not removed, will flake into abrasive particles, which can cause damage to subsequent products. Cleaning the substrate holders usually requires grit blasting or very aggressive chemical etching, which must be repeated every few coating runs or, if very few defects are required, after each coating run. Even hardened steel substrate holders wear out rapidly, resulting in that the substrate holders and the maintenance thereof are a significant cost in the coating process, and a major source of particulate generated defects.

Conventional planetary gear coating systems, such as the one disclosed in U.S. Pat. No. 5,106,346, issued Apr. 21, 1992 to Stefan Locher et al, includes a large rotating platform with several individual spindles (planets) rotatable thereon disposed within a sealed vacuum chamber. Unfortunately, each substrate holder must be connected to a mounting flange on each spindle using mechanical fasteners, e.g. bolts, requiring manual replacement. Not only do these mechanical systems require extra manual labor, they are more susceptible to misalignment caused by changes in temperature and pressure.

In order to isolate as much of the bearing and gear structure as possible from the vacuum chamber, Hurwitt et al disclosed a planetary gear coating system in U.S. Pat. No. 5,795,448 issued Aug. 18, 1998, which includes a magnetic link in the shaft of each spindle. The substrate holders are not suspended over the cathodes, and still require mechanical fasteners for attachment to the mounting flanges of the spindles.

The coating system, disclosed in U.S. Pat. No. 6,464,825 issued Oct. 15, 2002 to Shinozaki, includes a robotic arm traveling between a pressurized loading/unloading chamber and the main vacuum chamber to minimize the amount dust entering the main vacuum chamber. The Shinozaki system also includes a magnetic rotational drive and a magnetic levitating member to minimize particulate generation caused by interacting mechanical elements. However, Shinozaki discloses a single rotating platform with a complicated levitating platform and electromagnets that totally surround the substrate holder. Unfortunately, this approach would be impossible to implement in a planetary gear coating system, as it is very difficult to deliver power separately to individual rotating substrate holders in a planetary system, while operating in a vacuum and at elevated temperatures.

An object of the present invention is to overcome the shortcomings of the prior art by providing a substrate holder with a disposable cover, which is easily removable from the base, and can be easily dismantled to remove the substrate therefrom.

SUMMARY OF THE INVENTION

Accordingly, the present invention relates to a substrate support for mounting in a process chamber of a coating system, comprising:

at least one spindle rotatable about respective spindle axes;

a latch on an end of each spindle including a mounting surface; and a releasable substrate holder for mounting on the mounting surface of said latch, said substrate holder including a base and a cover mounted on an end face of the base for supporting a substrate;

wherein the cover includes an opening to expose the substrate, a lip surrounding the opening for holding an edge of the substrate against the base, and a protective region covering the end face of the base for protecting the base from stray coating material;

wherein the cover is made of a sheet metal; and wherein the cover is releasably attached to said base for removal therefrom

BRIEF DESCRIPTION OF THE DRAWINGS

The invention will be described in greater detail with reference to the accompanying drawings which represent preferred embodiments thereof, wherein:

FIG. 6b is a cross sectional view of the stator of FIG. 6a;

FIG. 9b are top view of the substrate holder of FIG. 9a; and

DETAILED DESCRIPTION

Figure 1:
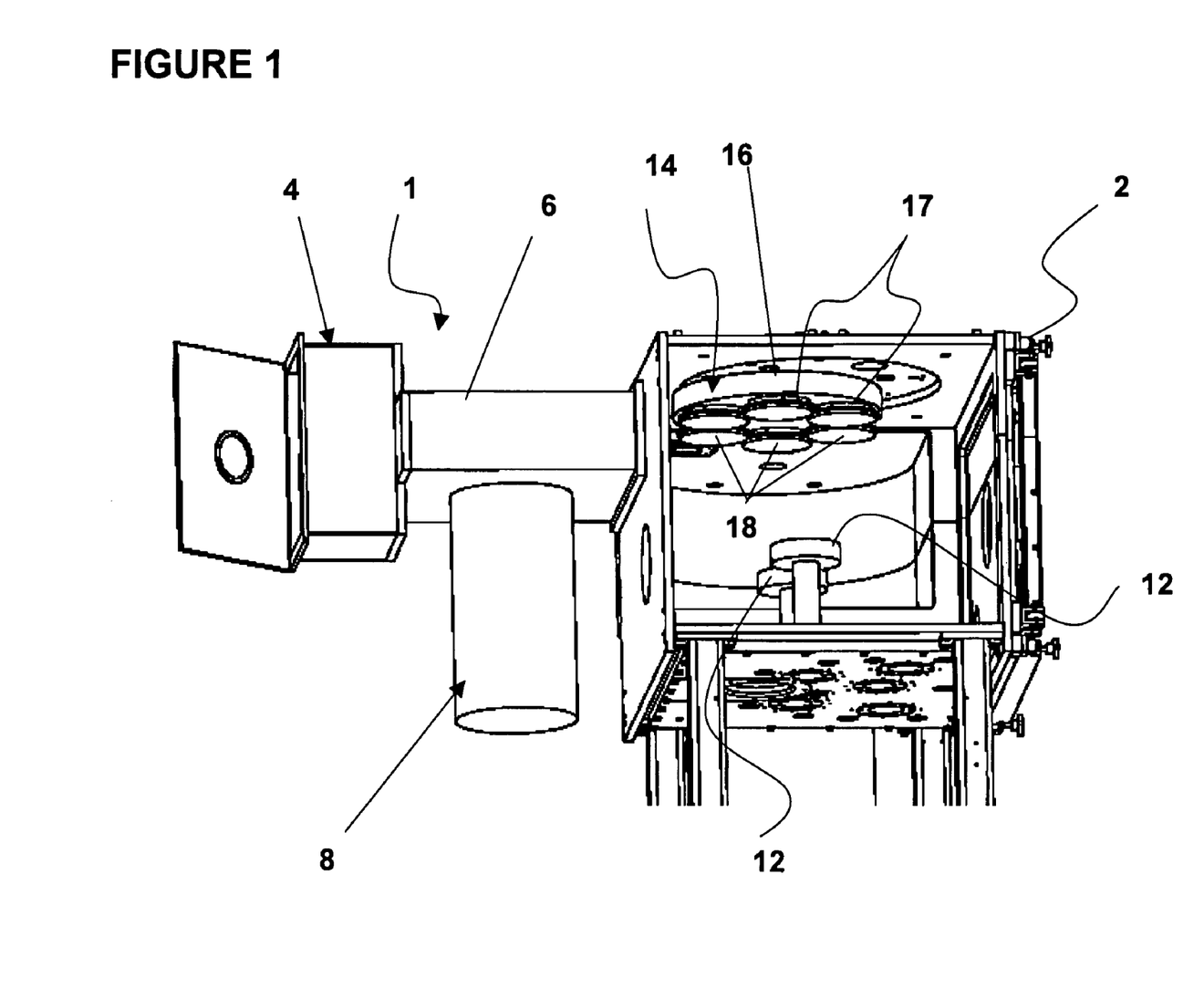
FIG. 1 is an isometric view of the coating system according to the present invention.
Figure 2:
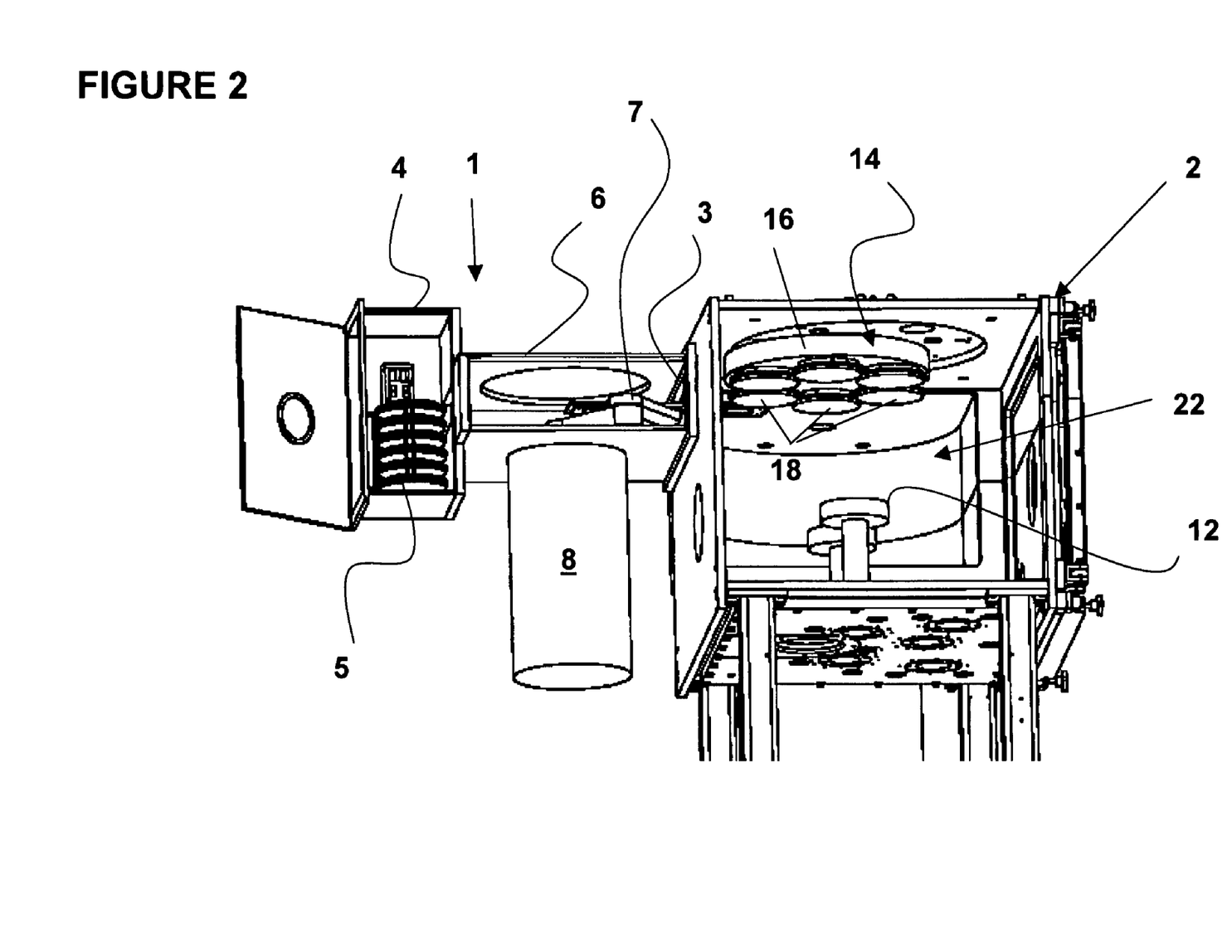
FIG. 2 is an isometric view of the coating system of FIG. 1 with some outer wall removed.
Figure 3:
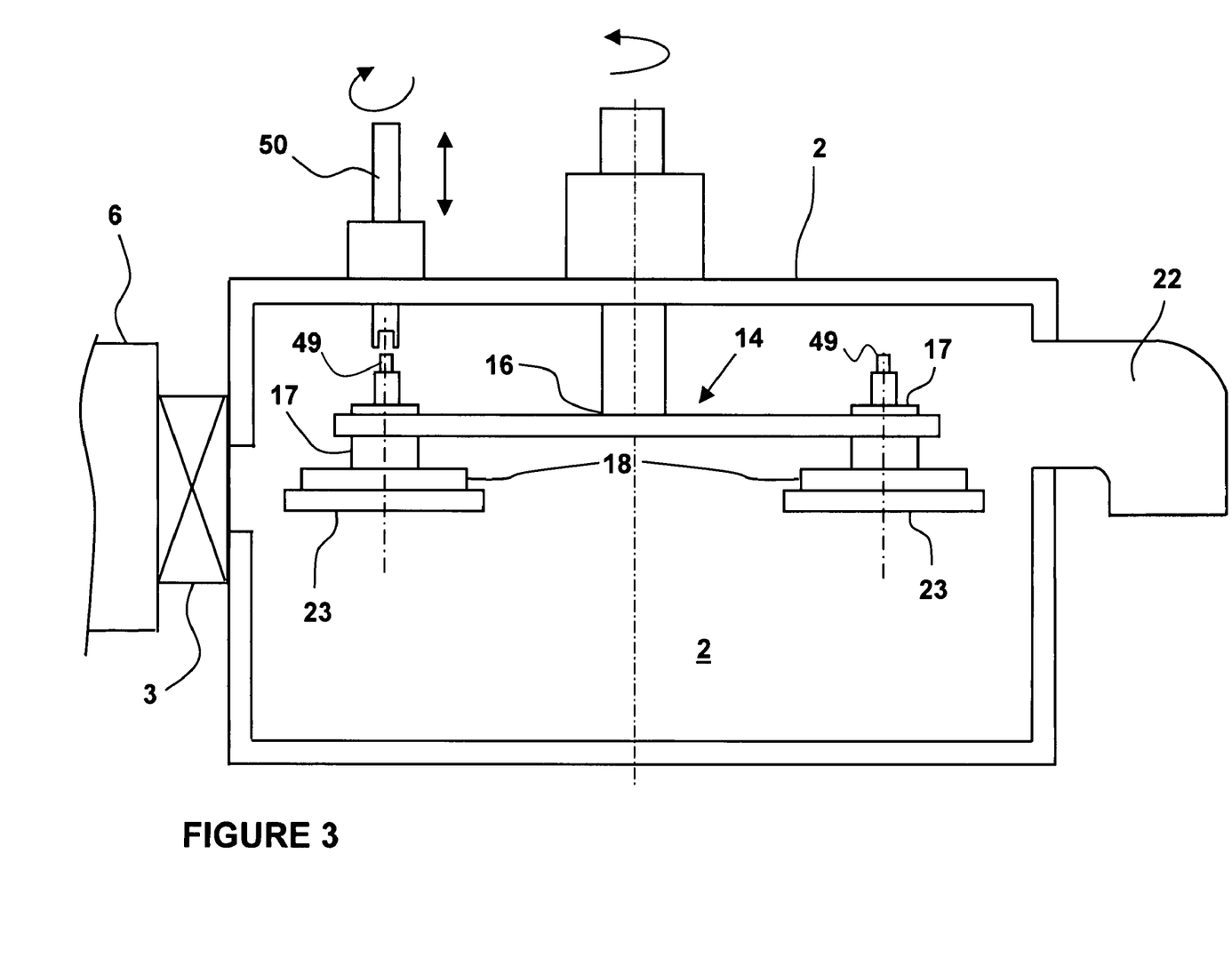
FIG. 3 is a schematic illustration of a planetary substrate holder with a magnetic latch according to the present invention.

With reference to FIGS. 1 to 3, the vapor deposition vacuum system, e.g. Physical Vapor Deposition (PVD) or Chemical Vapor Deposition (CVD), according to the present invention includes a load lock chamber, generally indicated at 1, and a process chamber 2 with a gate valve 3 therebetween. The gate valve 3 enables the pressure in the load lock chamber 1 to be brought to atmospheric pressure for loading and unloading of substrates or to be re-established to the pressure of the process chamber 2 for substrate transfer, independently of the pressure in the process chamber 2. The load lock chamber 1 includes a loading container 4 with a cassette elevator 5 therein, and a transfer channel 6 with a robotic arm 7 therein. The control mechanism for the robotic arm 7 is mounted in the cylindrical canister 8 extending from the transfer channel 6.

A cathode 12, and a planetary substrate support 14 are mounted within the process chamber 2. The planetary substrate support 14 comprises a main cylindrical platform 16 rotatable about a first axis, with a plurality of, e.g. six, spindles 17 extending therefrom, each spindle 17 rotatable about its own axis, which are preferably parallel to the first axis, but may be at some other angle. In use, as the main platform 16 is rotated, each individual spindle 17 is also rotated to ensure even coating over all portions of each substrate. Each spindle 17 includes a magnetic latch 18 at the outer free end thereof for suspending a substrate over the cathode 12, which will be further described hereinafter At least one cathode 12, preferably low arcing cathodes, are mounted inside the process chamber 2. Extra cathodes 12 may be provided for backup in case of failure or in case the coating supply in one cathode 12 becomes exhausted. Alternatively, several different cathodes 12 can be provided to enable the deposition of different coatings consecutively without opening up the process chamber 2 to the atmosphere. Preferably, minor adjustments can be made to the position of the cathode 12 by movement a mounting platform (not shown), manually or by remote control.

The process chamber 2 is evacuated through pumping port 22, while process gases are supplied to the process chamber 2 via mass flow controllers (not shown).

While sputter deposition vacuum systems have been described herein, the planetary substrate support according to the present invention can be utilized with any other suitable coating system such as evaporative systems or CVD systems.

The coating process can be enhanced by additional equipment such as shutters, masks, ion bombardment devices, advanced anode concepts, or plasma activation systems.

While the coating system is shown in a sputter up configuration herein, magnetic latch according to the present invention can be utilized in other orientations such as coating down and coating sideways.

Uncoated substrates mounted in substrate holders 23 are loaded onto the cassette elevator 5 with the gate valve 3 closed, thereby maintaining the pressure in the process chamber 2. When the load lock chamber 1 is evacuated, the gate valve to the process chamber 2 opens and the robotic arm 7 transfers each substrate holder 23 through the transfer channel 6 and the open valve gate 3 to the process chamber 2 for mounting onto the spindles 17 with the help of the magnetic latches 18.

Figure 4A:
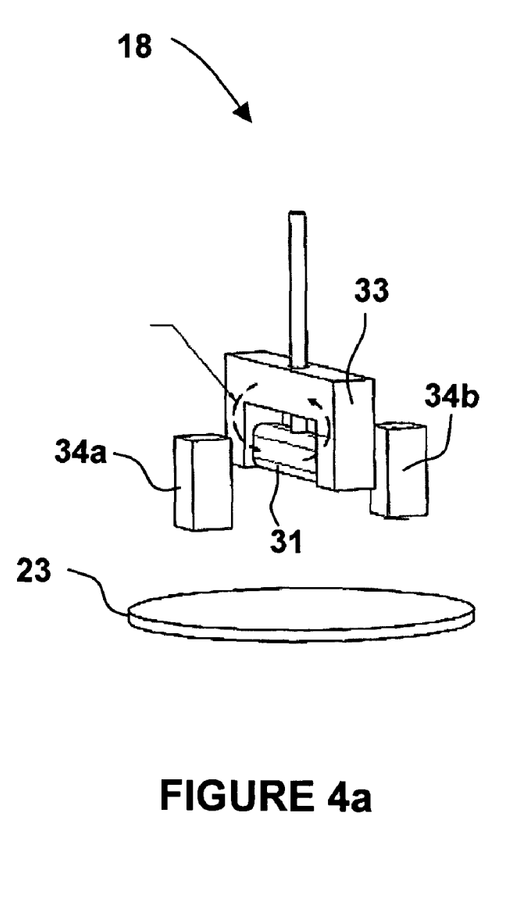
FIGS. 4a to 4c are schematic illustrations of the basic principle of the magnetic latch according to the present invention.
Figure 4B:
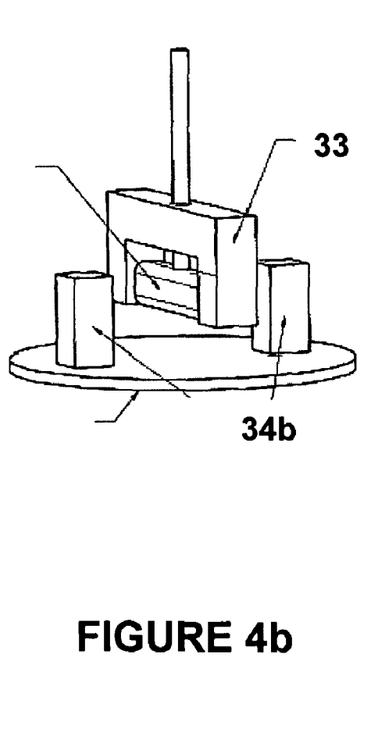
Figure 4C:
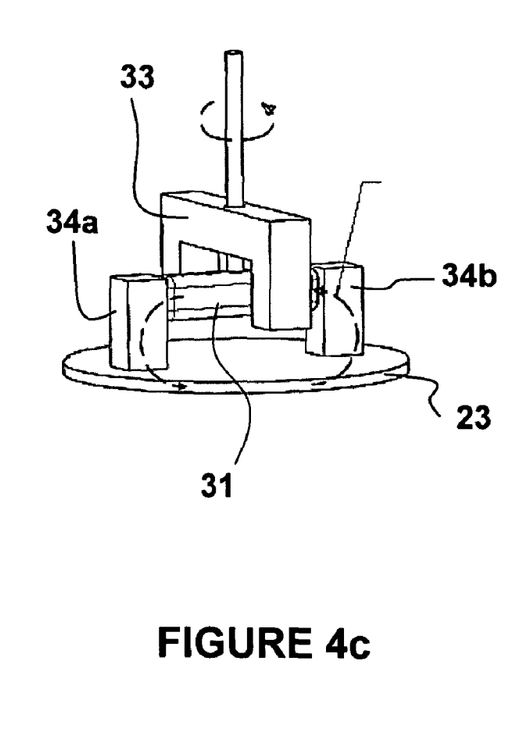

The basic principle behind the magnetic latch 18 is illustrated in FIG. 4a to 4c, in which a permanent magnet 31 is disposed in an unlatched position (FIGS. 4a and 4b) or a latched position (FIG. 4c). In FIG. 4a, a magnetic circuit, indicated by arrow 32, is completed through a bypass section 33 leaving poles 34a and 34b un-magnetized. In FIG. 4b, the substrate holder 23 is brought in contact with the poles 34a and 34b providing an alternative magnetic circuit. To complete the alternative magnetic circuit, indicated by arrow 36 in FIG. 4c, the permanent magnet 31 is rotated into alignment with the poles 34a and 34b, thereby ensuring that the substrate holder 23 is magnetically attracted by the poles 34a and 34b. Alternatively, the permanent magnet 31 can remain fixed, while the bypass section 33 and the poles 34a and 34b are moved into and out of alignment therewith.

A preferred embodiment of the magnetic latch 18, illustrated in FIGS. 5, 6a, 6b and 7, includes a cylindrical stator 41, with a cylindrical rotor 42 rotatable thereon. The stator 41 includes three sets of stator poles 43a and 43b fixed to a base 44 by a plurality of mechanical fasteners, e.g. hex bolts 46, ensuring good contact. The rotor 42 includes three radially extending permanent magnets 47 sandwiched between rotor poles 48a and 48b. The north and south poles of the permanent magnets extend along the long sides thereof adjacent to the rotor poles 48a and 48b, respectively. Each magnetic latch 18 includes an elongated actuator 49 extending down through the main platform 16 and each spindle 17 for rotating the rotors 42 between the latched position (FIG. 5) and the unlatched position (FIG. 7) from outside of the process chamber 2. The actuator 49 includes a tongue or other engageable feature on the upper end thereof for engagement by another mechanical device, e.g. a shaft 50 (FIG. 3), above the planetary substrate support. In the unlatched position both of the rotor poles 48a and 48b are rotated adjacent to one of the stator poles 43b, thereby shorting the permanent magnet 47, breaking the magnetic circuit through the stator 41, thereby unmagnetizing the stator 41 and releasing the substrate holder 23.

Figure 5:
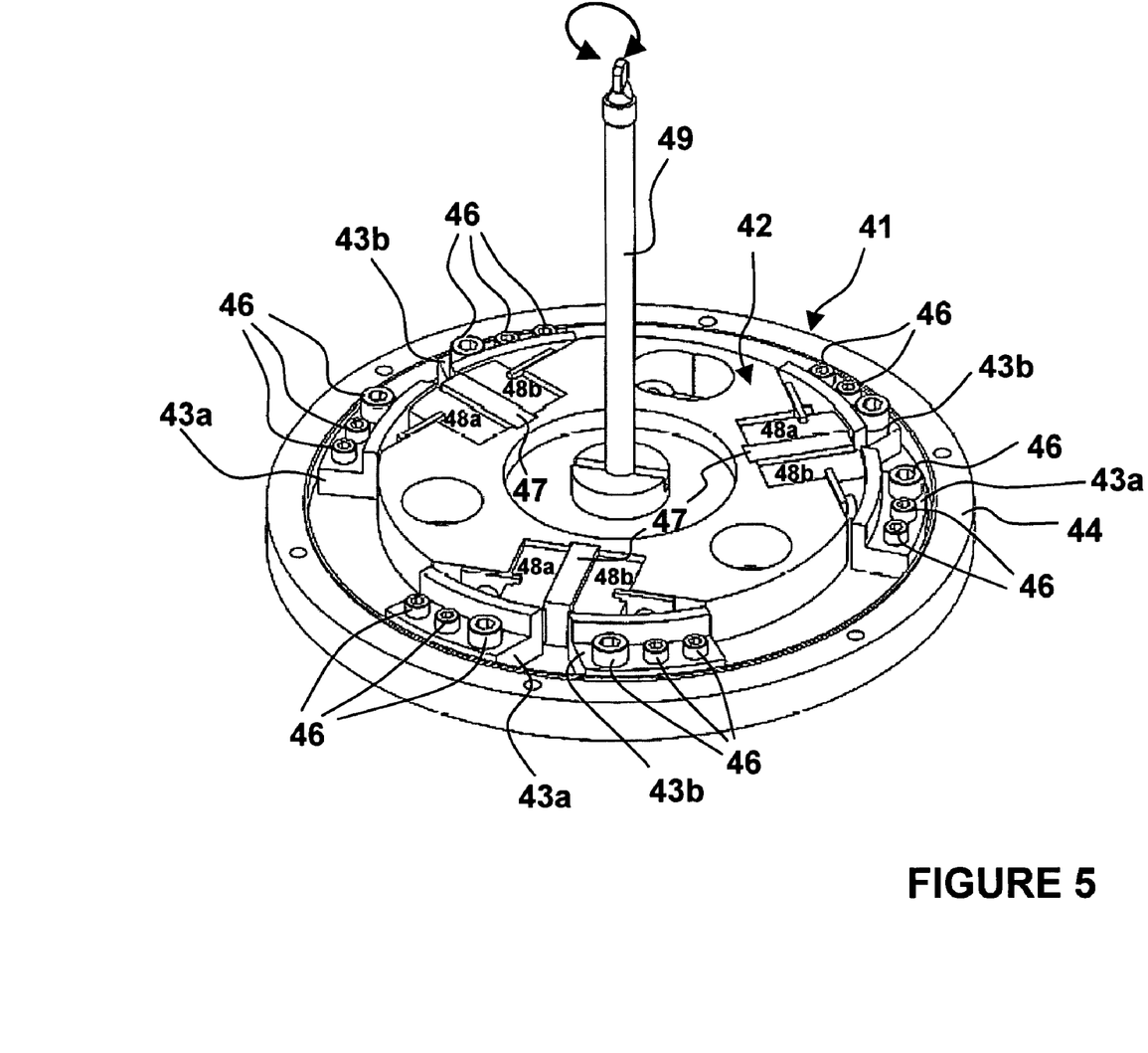
FIG. 5 is an isometric view of a magnetic latch according to the present invention.
Figure 6A:
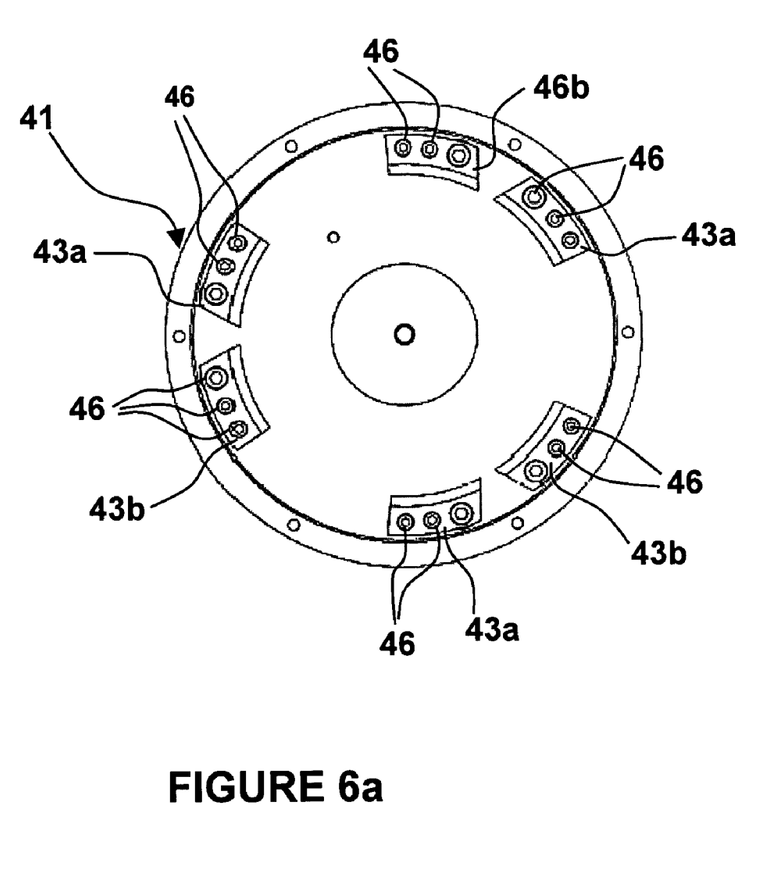
FIG. 6a is a top view of a stator of the magnetic latch of FIG. 5.
Figure 6B:
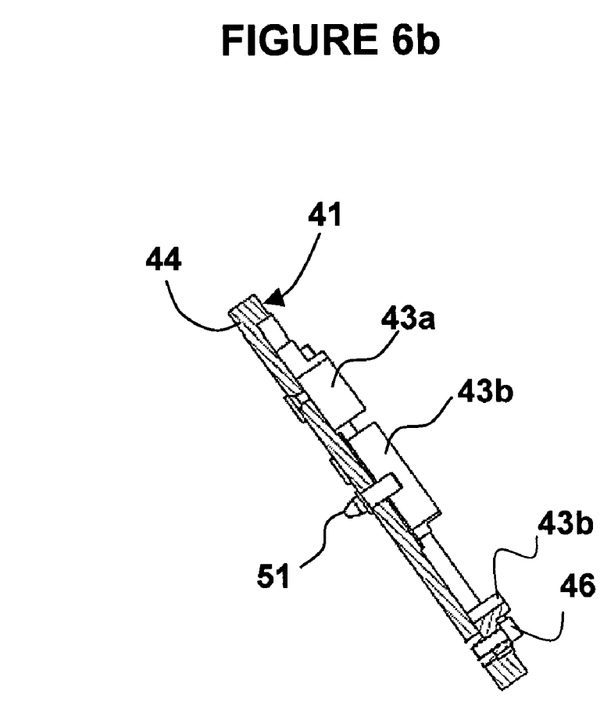
Figure 7:
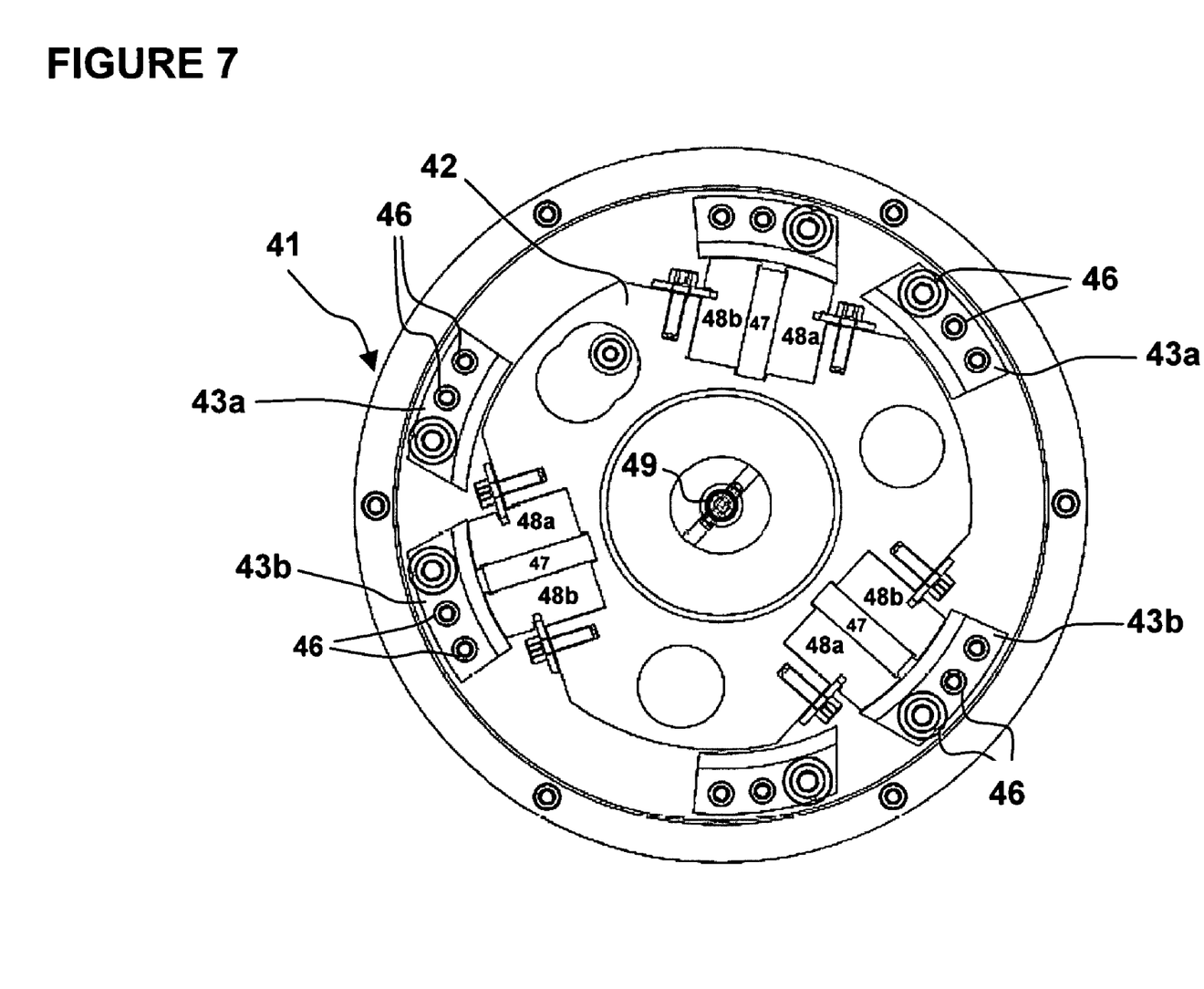
FIG. 7 is a top view of the magnetic latch of FIG. 5 in the unlatched position.

To facilitate alignment of the substrate holder 23 with the stator 41, a tapered pin 51 is provided extending from the center of the base 44. A single tapered pin 51 in the center of the base 44 provides an alignment feature, which ensures the proper alignment of the substrate holder 23 without dictating the exact angular orientation thereof. Tapered pins can be positioned at other positions around the circumference of the stator or other radial positions.

Examples of substrate holders 23 are illustrated in FIGS. 8a to 8d. The substrate holder 23a, in FIG. 8a, includes a base 53 fastened to an annular cover 54, which includes an annular shoulder 56 for supporting a single substrate 57. A cylindrical recess 55 is provided in the base 53 for receiving the tapered pin 51, thereby providing a mating alignment feature therefor. The base 53 if formed entirely or at least partially of a material that is attracted by the magnetic latch 18, e.g. a ferromagnetic material including one or more of iron, cobalt and nickel. The base 53 also provides a protective cover for the uncoated side of the substrate 57, thereby preventing unintentional and unwanted back coating. Substrate holder 23b (FIG. 8b) includes a multi-disk annular cover 58 fastened to the base 53. The multi-disk cover 58 includes a plurality of annular shoulders 59 for supporting a plurality of smaller substrates 61. For odd shaped substrates, such as prisms 62, a multi-prism cover 63 is provided for mounting to the base 53, see FIG. 8c.

Figure 8A:
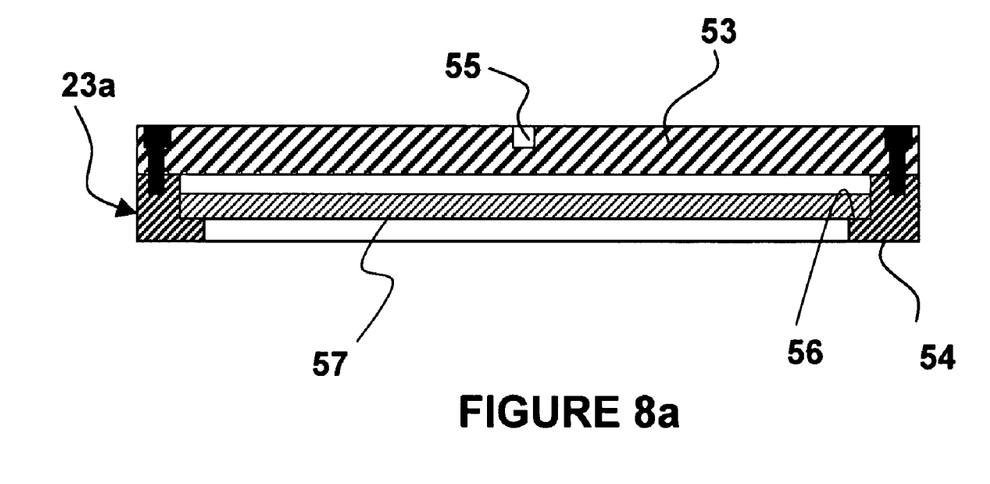
FIGS. 8a to 8d are cross-section views of substrate holders according to the present invention.
Figure 8B:
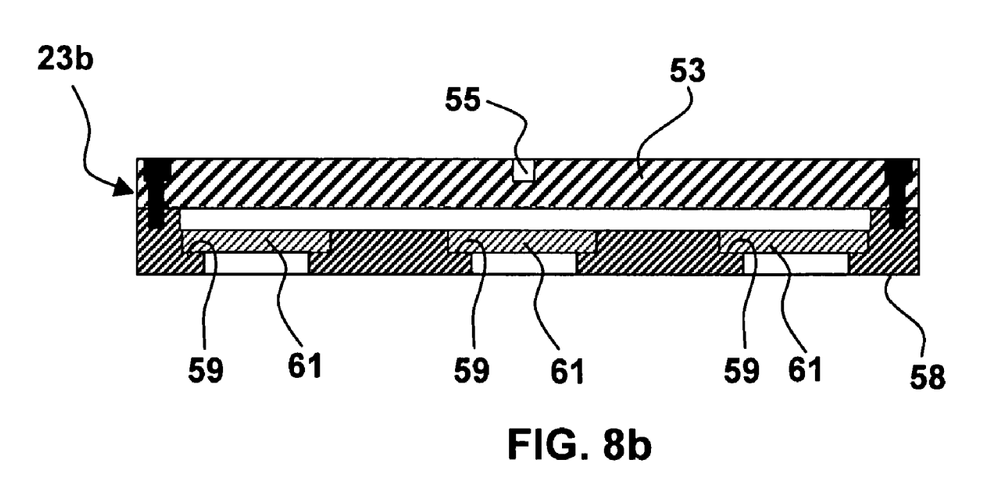
Figure 8C:
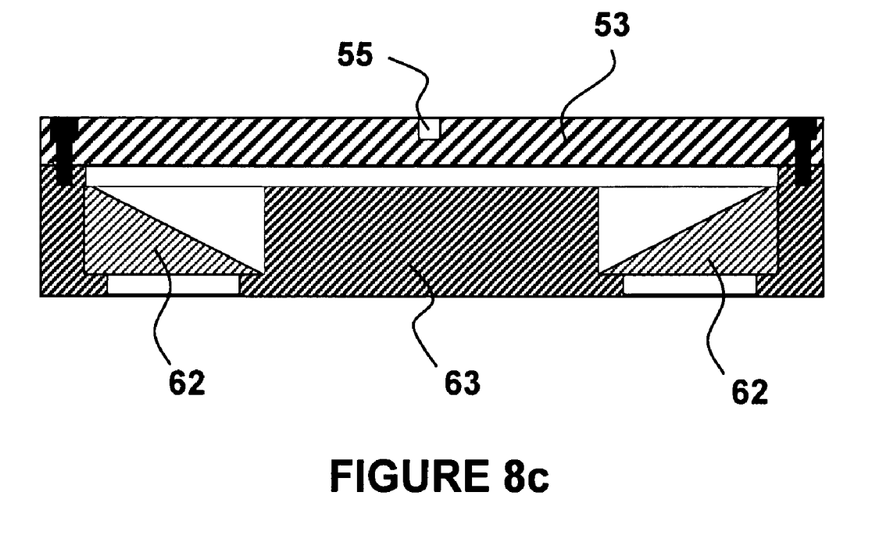
Figure 8D:
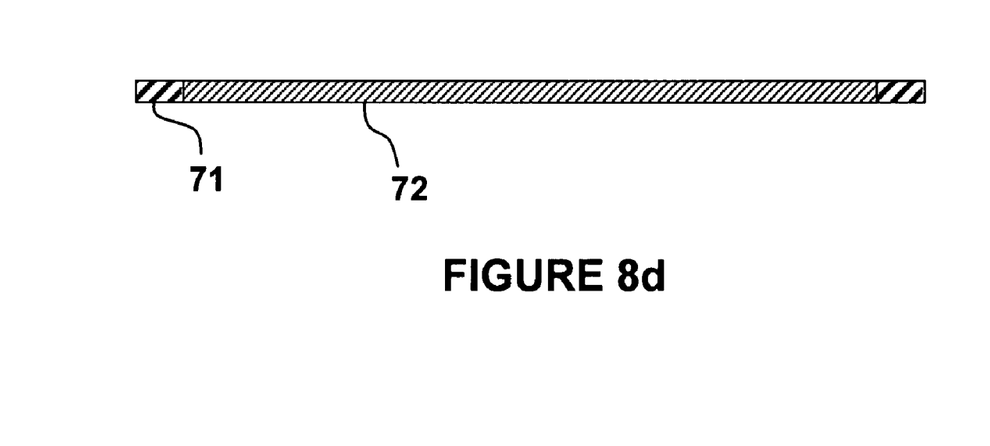

As an alternative to the base 53, a ferromagnetic ring 71, for attraction to the stator 41, surrounds a substrate 72 (FIG. 8d). An advantage to the ring 71 is the ability to coat the substrate 72 with the same or different coatings on opposite sides thereof without removing it from the ring 71. Moreover, the substrate 72 and ring 71 need not be removed from the process chamber 1, between coatings, e.g. simply flipped over by the robotic arm 7.

A typical substrate would be a glass wafer 200 mm in diameter and 0.2 mm to 1.4 mm thick; however, other substrate forms are possible, e.g. up to 32 mm in thickness and a mass of up to 2 kg.

Figure 9A:
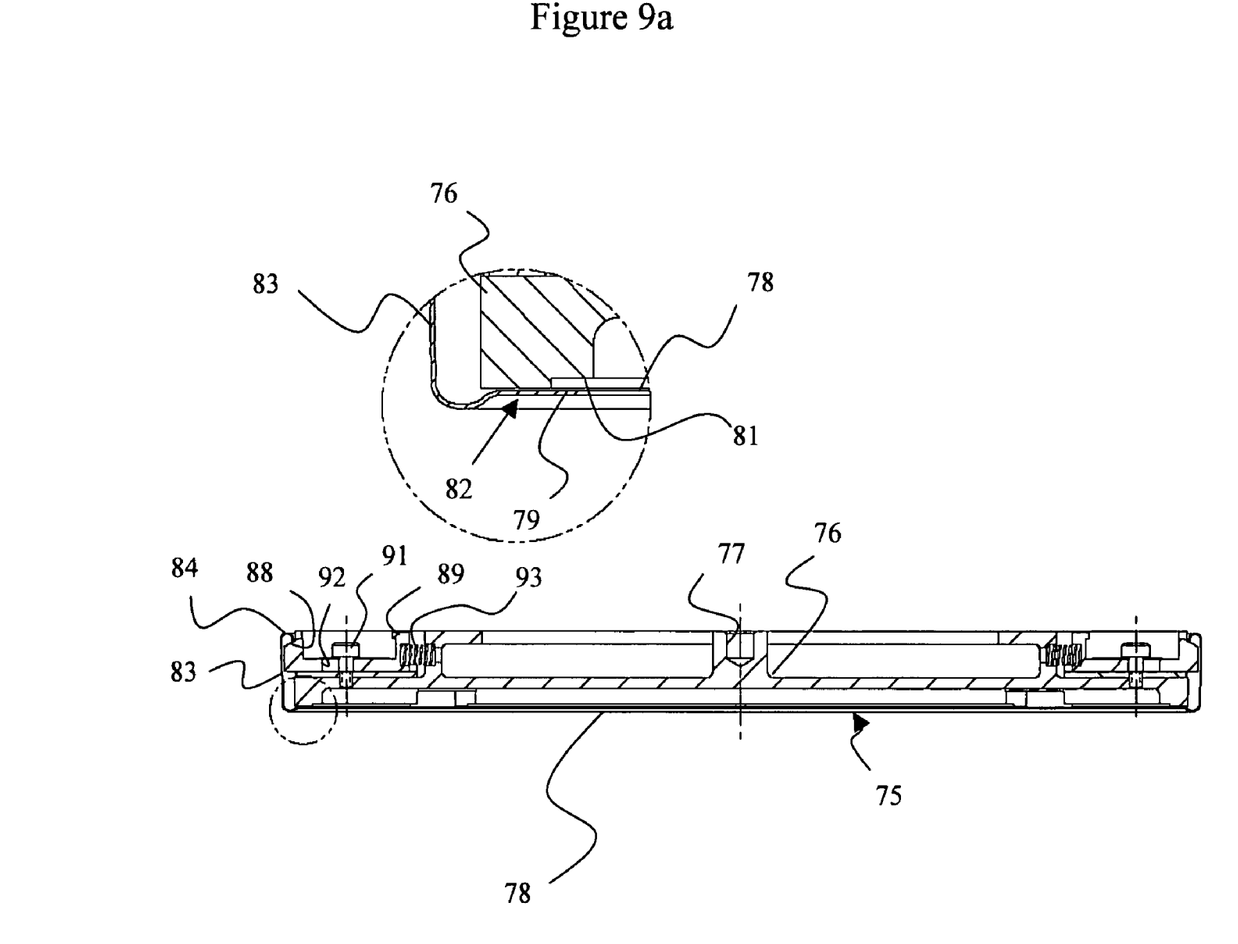
FIG. 9a is a cross-sectional side view of an alternative substrate holder.
Figure 9B:
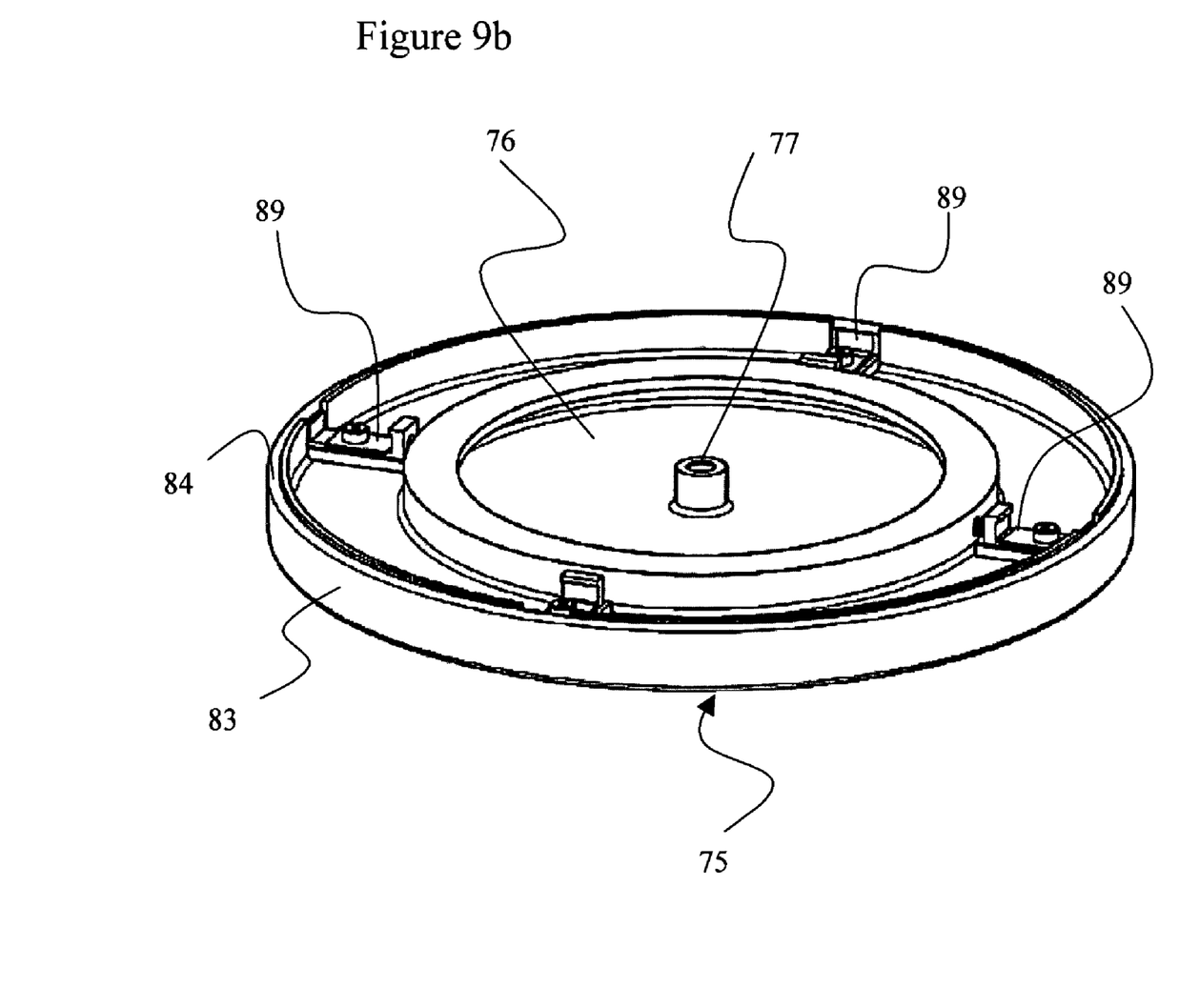

With reference to FIGS. 9a and 9b, a disposable cover 75 is mounted on a base 76, which, as above, is formed entirely or at least partially of a material that is attracted by the magnetic latch 18, e.g. a ferromagnetic material including one or more of iron, cobalt and nickel. The base 76 includes a cylindrical recess 77 for the tapered pin 51, and provides a protective cover for the uncoated side of the substrate, thereby preventing unintentional and unwanted back coating. The cover 75 includes one or more openings 78 for substrates, and defines a lip 79 extending around each opening 78. Each lip 79 holds an edge of a substrate in a slot 81 formed in an upper face of the base 76. The openings 78 are typically round, but could be any shape, e.g. square or oval, depending upon the shape of the substrate. The cover 75 also includes an annular intermediate region 82 to ensure the upper face of the base 76 is covered, thereby protected from stray coating material. An annular flange 83 extends perpendicularly from the intermediate region 82 adjacent to a sidewall of the base 76 to protect the sidewall of the base 76 from stray coating material. The outer free end 84 of the annular flange 83 is bent inwardly back around parallel with the rest of the annular flange 83 forming a clip for engaging a latching surface 88 the base 76. Alternatively, one or more separate clips could extend from the cover 75, perpendicular thereto, into engagement with a latching surface 88 on the base 82. Preferably, the clips would be made of a resilient material, e.g. the same sheet metal as the cover 75, enabling the clips and the cover 75 to be manually released with relative ease, i.e. without the aid of tools. Various mechanical means can be provided to facilitate disengagement of the clips including levers, push buttons and rotating knobs extending therefrom.

However, in the illustrated embodiment to facilitate removal of the cover 75 from the base 76, the latching surface 88 is disposed on a moveable wedge 89, which reciprocates towards the center, e.g. radially, of the base 76, i.e. towards cylindrical recess 77, when a sufficient force is applied thereto. A threaded fastener 91 extends through a slot 92 in the wedge 82 into the base 76 for guiding the wedge 89 during reciprocation. Springs 93 bias the wedges 89 outwardly into contact with the outer free end 84 (clip) of the annular flange 83, providing a set force, which must be manually overcome to release the cover 75 from the base 76.

Figure 10:
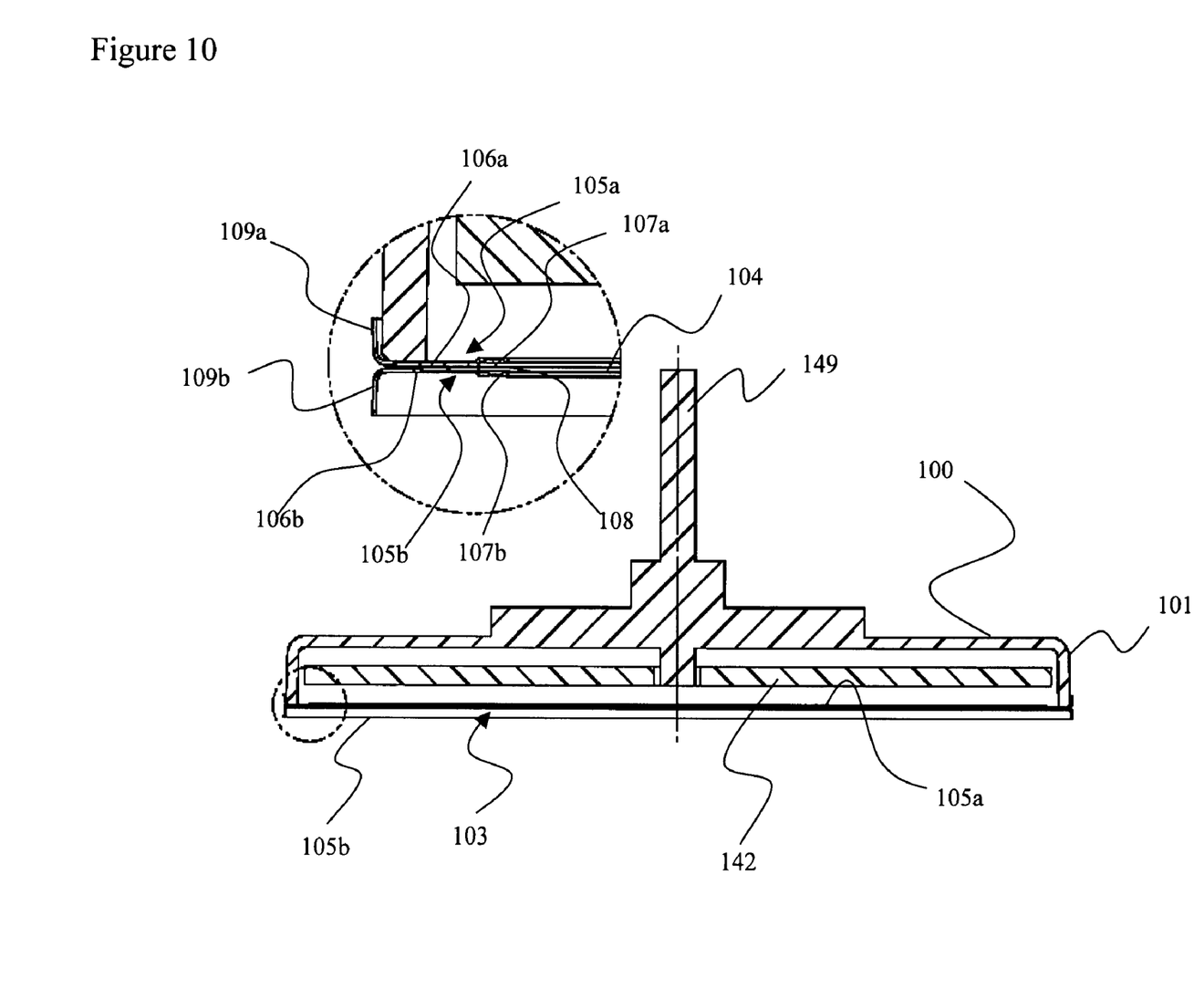
FIG. 10 is a cross-sectional side view of an alternative substrate holders.

The embodiment illustrated in FIG. 10, includes a modified stator portion 100 defined by an inverted cup shaped ferrous plate with a series of alternating north and south poles around a rim 101. The modified stator portion 100 is either mounted on the existing stator 41 or is a replacement therefore. A rotor 142 is provided along with actuator 149, as hereinbefore described. A disposable substrate holder 103 defines a substantially circular opening 104 into which a substrate is disposed. The substrate holder 103 is formed out of a first (base) ring 105a and a second (cover) ring 105b connected together at annular intermediate connecting regions 106a and 106b, respectively.

The first and second rings 105a and 105b may be attached together with metal or plastic tape, folded over tabs, or other means. A preferred method is to "spot bond" the first and second rings 105a and 105b at an appropriate number of points near the periphery of the first and second rings 105a and 105b in the connecting regions 106a and 106b. Spot bonds using spot welding equipment and techniques with very low currents provide sufficient strength. Bonds range in a continuum from just melting the tin to make a "solder" spot to a full spot-weld of the parent steel. The current to the spot welding equipment can be adjusted, so that the first and second rings 105a and 105b are held together securely for handling, but can be easily and gently separated to remove the substrate without the need of heavy tools or excessive force.

Each of the first and second rings 104a and 104b includes an annular lip 107a and 107b, respectively, extending inwardly from the connecting regions 106a and 106b, respectively, defining an annular slot 108 for receiving and clamping an edge of a substrate. Outer ends of the first and second rings 105a and 105b are bent perpendicularly to the connecting regions forming flanges 109a and 109b, respectively. While the connecting regions 106a and 106b cover the outer face of the rim 101, the flange 109a extends along the side of the rim 101 for shielding the side of rim 101 from stray coating material and preventing stray coating material from traveling between the substrate holder 103 and the rim 101 onto the back surface of the substrate. Moreover, the flange 109a fits around the rim 100 to center the substrate holder 103 on the magnetic latch 18. The flange 109b extends outwardly from the connecting region 106b facilitating grasping, i.e. by machine or manually, for removal of the substrate holder 103 from the rim 101, and for protecting the base from stray coating material. In a preferred embodiment the robotic arm 7 includes a n annular reception surface, which fits inside the flange 109b for receiving the substrate holder 103 when released from the magnetic latch 18.

To minimize costs and facilitate storage, the first and second rings 105a and 105b are identical to each other; however, the first and second rings 105a and 105b can be different, e.g. non-symmetrical, to suite specific needs, e.g. special friction tabs can be formed into the lips 107a and/or 107b to support various substrates. Furthermore, one of the rings could be a flat ring, i.e. without the annular flange or the lip. However, if the first and second rings 105a and 105b are identical, the substrate holder 103 can be easily flipped over for coating of the opposite side of the substrate. First and second rings 105a and 105b, which are intended to be flipped, must both be formed entirely or at least partially of a material that is attracted by the magnetic latch 18, e.g. a ferromagnetic material including one or more of iron, cobalt and nickel.

The substrate holders, illustrated in FIGS. 9 and 10, utilize disposable covers 75, and 105b, which are fabricated from an inexpensive sheet metal stamping, which can be disposed of after one or two uses. The covers 75 and 105b hold the substrate securely and precisely relative to the bases 76 and 105a, respectively, during acceleration, vibration and temperature cycling. Moreover, the covers 75 and 105b shield the bases 76 and 105a from stray coating flux, which would otherwise become deposited on the bases 76 and 105a causing damage to the substrates, if flaked off.

Ideally the disposable covers 75 and 105b are ferromagnetic, so that they will be magnetically attracted by the stator 41 or the modified stator portion 100 via the base 76 and 105b, although cover 75 need not be ferromagnetic as it is mechanically attached to the base 76. Moreover, the covers 75 and 105b should include surface materials or characteristics, which encourage adhesion of stray coating material. The covers 75 and 105b should be inexpensive, easily formable with enough resiliency to provide spring forces when appropriate, have a low vapor pressure at coating temperatures, and have minimal toxic waste issues. In practice, the covers 75 and 105b are up to 0.030 in. thick, but preferably up to 0.025 in. or even up to only 0.020 in. thick. Thinner covers are possible for very small substrates, i.e. between 0.005 in. to 0.015 in. is preferred. Preferably, the covers 75 and 105b are fabricated from electro-tinned steel (Tin Plate), which is relatively inexpensive, magnetic, and easily formed. The tin plating has a low vapor pressure (5.78 E-21 Pa @232.06° C.) at coating temperatures, which minimizes any material released therefrom from contaminating the substrates, and provides relatively good adhesion for most metals and metal oxides, whereby stray coating material will stick to the covers 75 and 105b rather than deflect onto the substrate. For coating applications above the melting point of tin (232° C.), other sheet metals, such as aluminum and stainless steel, can be used. Surface treatments may be necessary to improve the adhesive characteristics of aluminum and stainless steel.

I claim:

1. A coating system, comprising:
   a coating chamber;
   at least one spindle, located within said coating chamber, rotatable about respective spindle axes;
   a latch on an end of said spindle, located within said coating chamber, including a mounting surface structurally configured for mounting a substrate holder to said spindle within said coating chamber; and
   a substrate holder selectively connectable and disconnectable to said mounting surface of said latch when the latch is in a latched position and when the latch is in an unlatched position, respectively, said substrate holder including a base and a cover mounted on an end face of the base for supporting a substrate;
   wherein the cover includes an opening to expose the substrate, a lip surrounding the opening for holding an edge of the substrate against the base, and a protective region covering the end face of the base for protecting the base from stray coating material, an annular flange extending substantially perpendicularly from said protective region for protecting the base from stray coating material;
   wherein the cover is made of a sheet metal;
   wherein the outer free end of the annular flange forms a resilient clip for releasably attaching the cover to said base for removal therefrom;
   wherein said latch is a magnetic latch which is configured to selectively magnetically connect and disconnect said substrate holder to said mounting surface, and wherein said latch is configured to be operable such that said latch magnetizes and demagnetizes said mounting surface; and
   wherein said latch includes a first section and a second section and wherein said second section is moveable between a first and a second position, wherein when said second section is in said first position, said mounting surface is magnetized and wherein when said second section is in said second position, said mounting surface is demagnetized.

2. The coating system according to claim 1, further comprising a reciprocating latching surface on said base moveable between a first position engaging said clip and a second position in which the clip is released.

3. The coating system according to claim 2, wherein said latching surface is spring biased into said first position.

4. The coating system according to claim 1, wherein the annular flange extends outwardly away from said cover for facilitating grasping of the substrate holder.

5. A coating system, comprising:
   a coating chamber;
   at least one spindle, located within said coating chamber, rotatable about respective spindle axes;
   a latch on an end of said spindle, located within said coating chamber, including a mounting surface structurally configured for mounting a substrate holder to said spindle within said coating chamber; and
   a substrate holder selectively connectable and disconnectable to said mounting surface of said latch, said substrate holder including a base and a cover mounted on an end face of the base for supporting a substrate;
   wherein the cover includes an opening to expose the substrate, a lip surrounding the opening for holding an edge of the substrate against the base, a protective region covering the end face of the base for protecting the base from stray coating material, and an annular flange extending substantially perpendicularly from said protective region for protecting the base from stray coating material;
   wherein the cover is made of a sheet metal;
   wherein the cover is releasably attached to said base for removal therefrom;
   wherein the base comprises a lip, a protective region, and an annular flange opposite the lip, the protective region and the annular flange of the cover, respectively; wherein the lip of the base and the lip of the cover form an annular slot for receiving the substrate; and wherein the annular flange of the base extends adjacent to a side wall of said latch to protect the side wall from stray coating material;
   wherein the base and the cover have substantially the same structure enabling the substrate holder to be flipped over for coating both sides of the substrate;
   wherein said latch is a magnetic latch which is configured to selectively magnetically connect and disconnect said substrate holder to said mounting surface, and wherein said latch is configured to be operable such that said latch magnetizes and demagnetizes said mounting surface; and
   wherein said latch includes a first section and a second section and wherein said second section is moveable between a first and a second position, wherein when said second section is in said first position, said mounting surface is magnetized and wherein when said second section is in said second position, said mounting surface is demagnetized.

6. The coating system according to claim 5, wherein the protective region of the base is spot bonded to the protective region of the cover enabling manual disengagement thereof.

7. The coating system according to claim 6, wherein said latch is a magnetic latch for attracting the base to the spindle.

8. The coating system according to claim 7, wherein said magnetic latch comprises an annular rim for attracting the protective region of the base; wherein the annular flange of the base extends adjacent a side wall of said annular rim to protect the side wall of said annular rim from stray coating material.

9. The coating system according to claim 1, wherein said latch is a magnetic latch for attracting the base to the spindle.

10. The coating system according to claim 9, wherein said magnetic latch includes a first section, and a second section movable relative to the first section between a first position in which the permanent magnet forms a magnetic circuit in which the mounting surface forms a temporary magnet for attracting a substrate holder, and a second position in which the permanent magnet is short circuited and the mounting surface is demagnetized, thereby releasing the substrate holder from the magnetic latch and enabling the substrate and substrate holder to be removed from the magnetic latch and the process chamber.

11. The coating system according to claim 10, wherein each of the first sections comprises a stator including the mounting surface, and poles for aligning with the permanent magnet; and wherein each of the second sections comprises a rotor, including the permanent magnet for rotation between the first position in which the permanent magnet is aligned with the poles of the stator, and the second position in which the permanent magnet is not aligned with the poles of the stator, thereby demagnetizing the stator.

12. The coating system according to claim 11, wherein said magnetic latch further comprises an actuator extending through the spindle for rotating each rotor.

13. The coating system according to claim 11, wherein each rotor includes a plurality of permanent magnets; and each stator includes a plurality of poles for aligning with the plurality of permanent magnets.

14. The coating system according to claim 13, wherein each rotor includes a rotor pole on each side of each permanent magnet for aligning with respective stator poles, which forms a magnetic circuit through the mounting surface when in the first position, and for engaging a single stator pole, which shorts the permanent magnet when in the second position.

15. The coating system according to claim 1, wherein the cover is comprised of a sheet metal stamping of tin-plated steel to encourage adhesion of stray coating material thereto.

16. The coating system according to claim 1, wherein the cover is up to 0.015 inches thick.

* * * * *